United States Patent
Gamota et al.

(10) Patent No.: US 6,391,762 B1
(45) Date of Patent: May 21, 2002

(54) METHOD OF FORMING A MICROELECTRONIC ASSEMBLY WITH A PARTICULATE FREE UNDERFILL MATERIAL AND A MICROELECTRONIC ASSEMBLY INCORPORATION THE SAME

(75) Inventors: Daniel Gamota, Palatine; Robert Kenneth Doot, Schaumburg, both of IL (US); George Amos Carson, Jr., Rowland Heights, CA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/439,099

(22) Filed: Nov. 12, 1999

(51) Int. Cl.⁷ ......................................... H01L 21/4763
(52) U.S. Cl. ...................................... 438/618; 438/108
(58) Field of Search ................................ 438/106, 108, 438/125, 612, 613, 618, 127, 126; 257/666, 687, 737, 738, 778, 787

(56) References Cited

U.S. PATENT DOCUMENTS

| | | | |
|---|---|---|---|
| 4,999,699 A | 3/1991 | Christie et al. | 357/65 |
| 5,089,440 A | 2/1992 | Christie et al. | 437/209 |
| 5,120,678 A | 6/1992 | Hsiao et al. | 437/183 |
| 5,121,190 A | 6/1992 | Moore et al. | 357/80 |
| 5,523,920 A | 6/1996 | Hsiao et al. | 361/767 |
| 5,895,976 A | * 4/1999 | Morrell et al. | 257/778 |
| 5,930,598 A | * 7/1999 | Wille et al. | 438/108 |
| 6,034,333 A | * 3/2000 | Skipor et al. | 174/260 |
| 6,083,819 A | * 7/2000 | Wille et al. | 438/612 |

* cited by examiner

Primary Examiner—David Nelms
Assistant Examiner—Phuc T. Dang
(74) Attorney, Agent, or Firm—Daniel W. Juffernbruch

(57) ABSTRACT

A microelectronic assembly (10) incorporating a particulate free underfill material (32 includes a substrate (24) having a plurality of bond pads (26) disposed on a substantially planar die attach region (24), and an integrated circuit die (12) having a die face (16) and a plurality of bond pads (20). The die face (16) is superimposed over the substrate die attach region (24) so that each of the die face bond pads (20) is generally aligned with a corresponding one of the substrate bond pads (26) and such that the die face is spaced apart from the die attach region by a gap not greater than about 20 microns. Each of the die face bond pads (20) is connected to its corresponding one of the substrate bond pads (26) by a solder connection (30). A particulate free polymeric material (32) is disposed in the gap, with the polymeric material substantially encapsulating each of the solder connections.

22 Claims, 1 Drawing Sheet

METHOD OF FORMING A MICROELECTRONIC ASSEMBLY WITH A PARTICULATE FREE UNDERFILL MATERIAL AND A MICROELECTRONIC ASSEMBLY INCORPORATION THE SAME

This Invention was made with Government support under Agreement No. MDA972-95-3-0031 awarded by ARPA. The Government has certain rights in the invention.

FIELD OF THE INVENTION

The present invention relates generally to microelectronic assemblies having an integrated circuit die attached to a substrate by a plurality of solder connections, and more specifically relates to a microelectronic assembly having a particulate free underfill material.

BACKGROUND OF THE INVENTION

Many microelectronic assemblies are manufactured using the well known flip chip on board (FCOB) technique. In FCOB assembly, an integrated circuit die is provided which includes a plurality of bond pads, with each of the bond pads having deposited thereon a solder bump. The die is turned over or flipped and is superimposed over a substrate having a plurality of bond pads, such that each of the solder bumps is aligned with a corresponding one of the bond pads on the substrate. The die and the substrate are then reflow soldered together to form solder connections. The gap that remains between the downwardly facing die face and the upwardly facing substrate face is then filled using any one of a number of known underfill materials.

The underfill material, which typically contains silica or other particulates in a resin binder, serves to encapsulate the solder connections and serves to bond the die to the substrate. The underfill also increases the reliability of the microelectronic assembly during thermal cycling by enhancing the mechanical connection between the die and the substrate. Also, by having a coefficient of thermal expansion (CTE) between the CTE of the die and the CTE of the substrate, the underfill material lessens thermal expansion problems. Further, the particulate filler also enhances the shear strength of the filler material.

For a variety of reasons, it is desirable to manufacture such microelectronic assemblies with smaller and smaller gaps between the die and the substrate (typically termed "die standoff"). However, according to modern assembly methods, the underfill material is typically drawn into the gap using capillary action. Thus, the viscosity of the material is an important consideration. As the gaps gets smaller, the size of the particulate filler begins to interfere with the ability of the underfill material to flow freely into the gap. Although smaller particulate fillers for the underfill material are available, such smaller particulates are very expensive and increase the viscosity of the underfill material to unacceptable levels. High viscosity materials interfere with the capillary action and also hinder the encapsulation of the solder connections. Moreover, as the gap size decreases, the shear strength of the material becomes more important.

DETAILED DESCRIPTION OF THE PREFERRED EMBODIMENT

The following descriptions of the preferred embodiments are not intended to limit the scope of the invention to the precise forms disclosed, but instead are intended to be illustrative of the principles of the invention so that others may follow its teachings.

Figure 1:
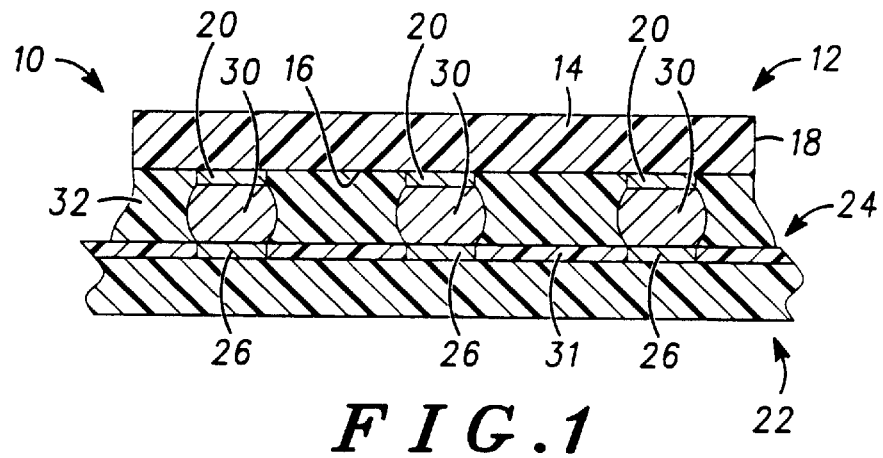
FIG. 1 is a cross sectional view of a microelectronic assembly constructed in accordance with the teachings of the present invention.
Figure 3:
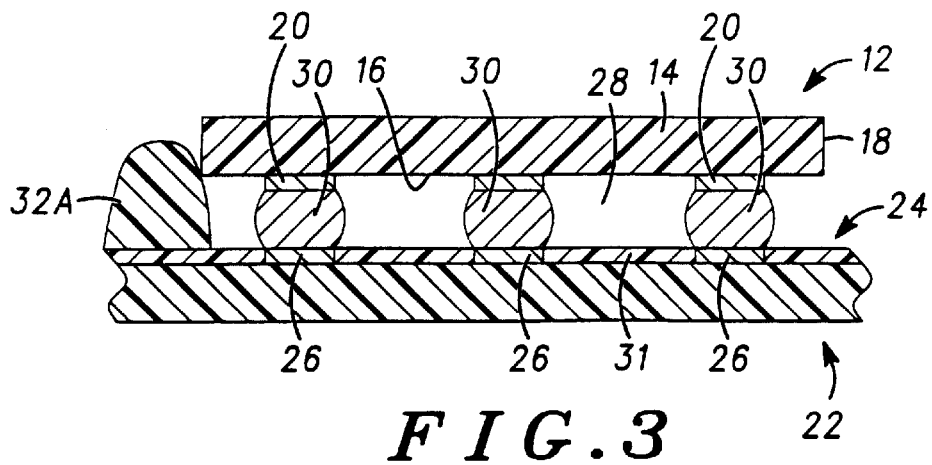
FIG. 3 is a cross sectional view similar to FIG. 1 but illustrating the deposition of the underfill material prior to being drawn into the gap under capillary action.

Referring now to the drawings, FIG. 1 illustrates a microelectronic assembly constructed in accordance with the teachings of the present invention and which is generally referred to by the reference numeral 10. The microelectronic assembly 10 includes an integrated circuit die 12 of the type generally well known in the art. As shown in FIGS. 1 and 3, the die 12 includes a die body 14, a die face 16, and a plurality of lateral edge portions 18. The die 12 has circuitry formed thereon (not shown) as is well known, and also includes a plurality of bond pads 20 disposed on the die face 16. The die 12 is typically mass produced from a silicon wafer (not shown) which has formed thereon a plurality of integrated circuit dies which are diced or singulated into one or more dies 12 as is well known in the art.

Figure 2:
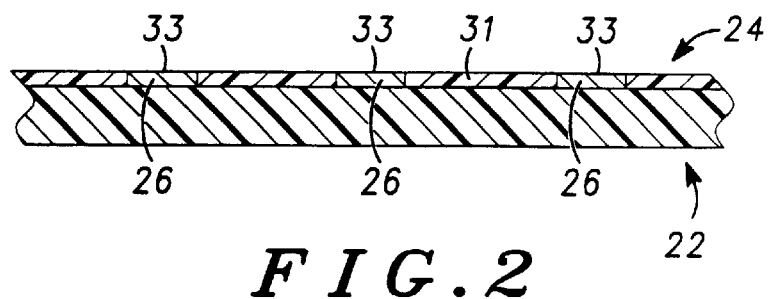
FIG. 2 is a fragmentary schematic elevational view of a substrate having a plurality of bond pads disposed on a substantially planar die attach region.

As shown in FIGS. 1–3, a substrate 22, such as a printed wiring board of the type commonly employed in the art and having circuitry (not shown) defined thereon, includes a substantially planar die attach region 24. A plurality of bond pads 26 are spaced about the die attach region 24. As shown in FIGS. 1 and 3, when the die 12 is flipped over such that the die face 16 faces the die attach region 24, each of the bond pads 20 on the die 12 will be registered or aligned with a corresponding one of the bond pads 26 on the substrate 22.

It will also be noted that when the die 12 is flipped over and aligned over the substrate 22, a gap 28 is formed between the die attach region 24 of the substrate 22 and the face 16 of the die 12. Each bond pad 20 on the die 12 and its the corresponding bond pad 26 on the substrate 22 are electrically connected by a plurality of solder connections 30. The die attach region 24 may be formed by deposition of a solder mask layer 31, which layer 31 is interspersed between the bond pads 26 so as to be generally coplanar with a surface 33 of each of the bond pads 26. As is known in the art, each solder connection 30 is typically formed from a solder bump (not shown) which is deposited on either each of the bond pads 20 of the die 12 or on each of the bond pads 26 of the substrate 22 prior to assembly of the microelectronic assembly 10. The solder connections 30 are formed from the solder bumps after the die 12 is positioned over the substrate 22 and properly aligned, typically by using the reflow soldering method as is known. In order to complete the microelectronic device 10, the gap 28 is filled with a polymeric material 32.

In further accordance with a preferred embodiment of the invention, the gap 28 has a height not great about 20 microns and preferably between 6 and 20 microns. Lower limits for the gap 28 may be suitable provided that the viscosity of the filler material. is sufficiently low to allow flow into the gap. It has been found that by minimizing the gap between the surface of die attach region and the die face, the polymeric encapsulant is able to reduce the stress experienced by the solder connections during thermal. cycling of the assembly during operation, and thus to improve reliability and extend the useful life of the assembly, despite the absence of particulate filler. This is attributed to a reduction in stresses due to CTE mismatch between the die and the substrate as the result of adhesion of the encapsulant to the adjacent surfaces, and is in marked contrast to prior art efforts to increase gap height and add particulate filler to distribute stresses due to CTE mismatch within a thicker encapsulant. In addition, it is found that the precursor, in the absence of particulate material, is readily drawn into the gap, despite the minimal. height, to provide a void-free fill suitable for protecting the solder connections from corrosion and deformation during operation. Thus, cycling in thermal. tests between −55° C. and 125° C. assemblies having gaps between 6 and 20 microns and filled with particulate free encapsulants.

As stated above, the filler material 32 is a particulate-free material or a substantially particulate free material. In general, the material 32 will consist of 60–80% by weight of a prepolymer, 20–40% by weight of a hardener, 0.1–1.0% by weight of a catalyst, and 0.01–0.10% by weight of a wetting agent. It will be noted that prior art formulations typically will range between about 25% to about 75% by weight of particulate fillers, typically silica. By comparison, the formulations discussed below will typically be substantially free of particulate fillers, except as impurities. Slightly higher filler contents may be tolerated depending on viscosity considerations.

The following formulations for the material 32 were considered:

Example Formulation #1

| Epoxy prepolymer | 66.0% |
|---|---|
| Triethyleneglycol diamine | 33.0% |
| 2-phenylimidazole | 0.95% |
| Aminosilane | 0.05% |

Example Formulation #2

| Epoxy prepolymer | 66.0% |
|---|---|
| Triethylene tetramine | 33.0% |
| 2-phenylimidazole | 0.95% |
| Aminosilane | 0.05% |

Example Formulation #3

| epoxy prepolymer | 74.0% |
|---|---|
| methyl tetrahydrophthalic anhydride | 25.0% |
| 2-phenylimidazole | 0.95% |
| Aminosilane | 0.05% |

Example Formulation #4

| epoxy prepolymer | 74.0% |
|---|---|
| Hexahydrophthalic anhydride | 25.0% |
| 2-phenylimidazole | 0.95% |
| Aminosilane | 0.05% |

As listed above in Example Formulations #1–#4, percentages refer to weight percentages. The epoxy prepolymer includes epoxy end groups that react during curing to form the product resin. A preferred epoxy resin is the reaction product of a bisphenol-derivative epoxy-base prepolymer and an amine-terminated polyether compound and includes a glycidyl ether of bisphenol-F to enhance structural integrity and to improve the mechanical properties of the resultant encapsulant. Alternatively, the prepolymer may contain moieties of a 2,5-dialkyl substituted furan instead of epoxy end groups. Such a prepolymer material is available from Shell®, a more complete description of which may be found in U.S. Pat. No. 5,760,337 issued to Iyer and assigned to Shell®. Other suitable epoxy resins are cycloauphatic, bisphenol-A type, naphthalene-phenolic type and other phenolic based epoxy resins.

Each of the epoxy formulations includes a hardener that reacts with the precursor to form the product resin. A suitable hardener is an amine-terminated polyether compound, preferably triethyleneglycol diamine. Alternatively the hardener may contain in its molecular structure two or more 2,5-dialkyl substituted furan group or two or more dienophiles (alkynes having electron withdrawing groups attached to both sides of the ethyne moiety e.g. ester and keto groups). Other suitable hardeners are isocyanates, melamines, aziridines, and anhydrides.

A catalyst is added to promote reaction of the constituents during curing. A preferred catalyst is 2-phenylimidazole. Other suitable catalysts are amines, acids and anhydrides.

The aminosilane is an adhesion promoter that enhances wetting of the substrate to promote adhesion of the resultant encapsulant. A preferred adhesion promoter is gamma-aminopropyltriethoxysilane. Other suitable adhesion promoters are fluoropolymers and silicones.

Example Formulation #5

| polyester prepolymer | 74.0% |
|---|---|
| Triethyleneglycol diamine | 25.0% |
| 2-phenylimidazole | 0.95% |
| Aminosilane | 0.05% |

Again, the percentages refer to weight percentages. Polyester resins are readily available and can offer designed physical properties. A preferred polyester resin is the reaction of a terephthalate based polyester prepolymer.

The polyester underfill formulation includes a hardener that reacts with the polyester prepolymer to form the product resin. A suitable hardener is an amine-terminated polyether compound, preferably triethyleneglycol diamine. Other suitable hardeners are isocyanates, melamines, aziridines, and anhydrides.

A catalyst is added to promote reaction of the constituents during cure. A preferred catalyst is 2-phenylimidazole. Other suitable catalysts are amines, acids and anhydrides.

The aminosilane again acts as adhesion promoter that enhances wetting of the substrate to promote adhesion of the resultant encapsulant. A preferred adhesion promoter is gamma-aminopropyltriethoxysilane. Other suitable adhesion promoters are fluoropolymers and silicones.

Example Formulation #6

| urethane resin | 74.0% |
|---|---|
| Triethyleneglycol diamine | 25.0% |
| 2-ethyl-4-methyl imidazole | 0.95% |
| Aminosilane | 0.05% |

As listed above in Example Formulation #6, percentages refer to weight percentages. Urethane resins provide great toughness and resiliency as an underfill or underencapsulant. A preferred urethane resin is made from aromatic diisocyanate for high temperature stability.

The urethane underfill formulation includes a hardener that reacts with the urethane prepolymer to form the product resin. A suitable hardener is an amine-terminated polyether compound, preferably triethyleneglycol diamine. Other suitable hardeners are isocyanates, melamines, aziridines, and anhydrides.

A catalyst is added to promote reaction of the constituents during cure. A preferred catalyst is 2-ethyl-4-methyl imidazole. Other suitable catalysts are amines, acids and anhydrides.

The aminosilane is again added as an adhesion promoter that enhances wetting of the substrate to promote adhesion of the resultant encapsulant. A preferred adhesion promoter is gamma-aminopropyltriethoxysilane. Other suitable adhesion promoters are fluoropolymers and silicones.

It will be understood that, regardless of the chosen formulation, the polymeric material 32 is initially a flowable material upon initial deposition such as is shown in FIG. 3 and which flowable material is represented as 32a. It will be understood that the flowable material may be deposited on the die attach region 24 of the substrate 22 and in contact with at least one lateral edge 18 of the die 12, such that the flowable material 32a will be drawn into the gap 28 due to capillary action. It will also be understood that the flowable material 32a may also be injected into the gap 28 under pressure or by using any other suitable methods as would be known. Subsequent to the flowable material 32a filling the gap 28, the flowable material 32a will be cured to a non-flowable material 32b in a manner to be explained in greater detail below.

Typically, underfill materials of the type commonly used in the prior art which contain silica particulates will have a viscosity of about 5,000 to 40,000 centipoisies. By comparison, prior to curing the present formulations will have a viscosity in the range of about 1500 centipoises or less.

As shown in FIG. 3, the polymeric material 32 is typically deposited next to the substrate 22 and the die 12 such that the polymeric material 32 is drawn into the gap 28 between the die attach region 24 of the substrate 22 and the face 16 of the die 12 by capillary action in a manner that is known in the art. The flowable material 32a is then cured to the non-flowable material 32 in FIG. 1 in an oven, preferably below the reflow temperature of the solder as would be known.

Those skilled in the art will appreciate that, although the teachings of the invention have been illustrated in connection with certain embodiments, there is no intent to limit the invention to such embodiments. On the contrary, the intention of this application is to cover all modifications and embodiments fairly falling within the scope of the appended claims either literally or under the doctrine of equivalents.

What is claimed:

1. A method of forming a microelectronic assembly, comprising the steps of:
    providing a substrate having a plurality of bond pads disposed on a substantially planar die attach region;
    providing an integrated circuit die having a die face and a plurality of bond pads;
    superimposing the die face over the substrate so that each of the die face bond pads is generally aligned with a corresponding one of the substrate bond pads and thereby forming a gap between the die face and the substrate die attach region;
    forming a solder connection between each of the die face bond pads and its corresponding one of the substrate bond pads; wherein said gap is not greater than about 20 microns; and
    filling the gap with a substantially particulate free polymeric material, thereby substantially encapsulating the solder connections.

2. The method of claim 1, wherein the gap is sized to be between about 6 microns and about 20 microns.

3. The method of claim 1, wherein the polymeric material has a CTE greater than about 35 ppm per degree Centigrade.

4. The method of claim 1, wherein the polymeric material comprises a thermoset polymer, and including the additional step of heat curing the polymeric material after the gap has been filled.

5. The method of claim 1, wherein the precursor has a viscosity of less than about 1500 centipoise.

6. The method of claim 1, wherein the polymeric material comprises an epoxy polymer.

7. The method of claim 1, wherein each of the substrate bond pads includes a contact surface and wherein the die attach region includes a solder mask layer interspersed between the substrate bond pads, each of the substrate bond pads being sized so that its contact surface is generally coplanar with a surface of the solder mask layer.

8. A method of forming a microelectronic assembly, comprising the steps of:
    providing a substrate having substantially planar polymeric surface and a plurality of bond pads, each of the substrate bond pads including a contact surface disposed generally coplanar with the polymeric surface;
    providing an integrated circuit die having a die face and a plurality of bond pads;
    superimposing the die face over the substrate so that each of the die face bond pads is generally aligned with a corresponding one of the substrate bond pads and thereby forming a gap between the die face and the substrate die attach region, the gap measuring about 20 microns;,
    forming a solder connection between each of the die face bond pads and its corresponding one of the substrate bond pads; and
    filling the gap with a substantially particulate free polymeric material thereby substantially encapsulating the solder connections.

9. The method of claim 8, wherein the step of filling the gap is accomplished using capillary action.

10. The method of claim 8, wherein the gap is sized to be between about 6 microns and about 20 microns.

11. The method of claim 8, wherein the polymeric material has a CTE greater than about 35 ppm per degree Centigrade.

12. The method of claim 8, wherein the polymeric material comprises a thermoset polymer, and including the additional step of heat curing the polymeric material after the gap has been filled.

13. The method of claim 8, wherein the precursor has a viscosity of less than about 1500 centipoise.

14. The method of claim 8, wherein the polymeric material comprises an epoxy polymer.

15. A microelectronic assembly, comprising:
    a substrate having a plurality of bond pads disposed on a substantially planar die attach region;
    an integrated circuit die having a die face and a plurality of bond pads, the die face being superimposed over the substrate die attach region so that each of the die face bond pads is generally aligned with a corresponding one of the substrate bond pads and further such that a gap is formed between the die face and the substrate die attach region, the gap measuring not greater than 20 microns;

each of the die face bond pads further being connected to its corresponding one of the substrate bond pads by a solder connection; and a substantially particulate free polymeric material disposed in the gap, the polymeric material substantially encapsulating each of the solder connections.

16. The microelectronic assembly of claim 15, wherein the gap is sized to be between about 6 microns and about 20 microns.

17. The microelectronic assembly of claim 15, wherein each of the substrate bond pads includes a contact surface and wherein the die attach region includes a solder mask layer interspersed between the substrate bond pads, each of the substrate bond pads being sized so that its contact surface is generally coplanar with a surface of the solder mask layer.

18. The microelectronic assembly of claim 15, wherein the polymeric material has a CTE greater than about 35 ppm per degree Centigrade.

19. The microelectronic assembly of claim 15, wherein the polymeric material comprises a thermoset polymer, the thermoset polymer being heat cured within the gap.

20. The microelectronic assembly of claim 15, wherein the polymeric material comprises a polymeric precursor material.

21. The microelectronic assembly of claim 15, wherein the polymeric precursor material has a viscosity of less than about 1500 centipoise.

22. The microelectronic assembly of claim 15, wherein the polymeric material comprises an epoxy polymer.

* * * * *